US011056178B1

(12) United States Patent
Bedeschi et al.

(10) Patent No.: US 11,056,178 B1
(45) Date of Patent: Jul. 6, 2021

(54) READ OPERATIONS BASED ON A DYNAMIC REFERENCE

(71) Applicant: Micron Technology, Inc., Boise, ID (US)

(72) Inventors: Ferdinando Bedeschi, Biassono (IT); Umberto Di Vincenzo, Capriate San Gervasio (IT); Riccardo Muzzetto, Arcore (IT); Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/933,829

(22) Filed: Jul. 20, 2020

(51) Int. Cl.
| | |
|---|---|
| *G11C 7/06* | (2006.01) |
| *G11C 11/4091* | (2006.01) |
| *G11C 11/4074* | (2006.01) |
| *G11C 11/404* | (2006.01) |
| *G11C 11/4099* | (2006.01) |
| *G11C 11/22* | (2006.01) |
| *G11C 11/24* | (2006.01) |

(52) U.S. Cl.
CPC .......... *G11C 11/4091* (2013.01); *G11C 7/06* (2013.01); *G11C 11/2273* (2013.01); *G11C 11/4045* (2013.01); *G11C 11/4074* (2013.01); *G11C 11/4099* (2013.01); *G11C 11/24* (2013.01)

(58) Field of Classification Search
CPC ... G11C 11/4091; G11C 11/2273; G11C 7/06; G11C 11/4045; G11C 11/4099; G11C 11/4074; G11C 11/24
See application file for complete search history.

(56) References Cited

U.S. PATENT DOCUMENTS

2018/0151203 A1* 5/2018 Yu ........................... G11C 7/10

OTHER PUBLICATIONS

U.S. Appl. No. 16/908,299, by Bedeschi et al., filed Jun. 22, 2020 (47 pages).

* cited by examiner

*Primary Examiner* — Jay W. Radke
(74) *Attorney, Agent, or Firm* — Holland & Hart LLP

(57) ABSTRACT

Methods, systems, and devices for read operations based on a dynamic reference are described. A memory device may include a set of memory cells each associated with a capacitive circuit including a first and second capacitor. After receiving a read command, the memory device may couple each capacitive circuit with a respective memory cell (e.g., to transfer a charge stored by each respective memory cell to a capacitive circuit) and may couple the second capacitor of each capacitive circuit to a reference voltage bus. Thus, a reference voltage on the reference voltage bus may be based on an average charge across the second capacitors of each capacitive circuit. The memory device may then compare a charge stored by the first and second capacitors of each capacitive circuit with the reference voltage bus and may output a set of values stored by the set of memory cells based on the comparing.

26 Claims, 9 Drawing Sheets

READ OPERATIONS BASED ON A DYNAMIC REFERENCE

BACKGROUND

The following relates generally to one or more systems for memory and more specifically to read operations based on a dynamic reference.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
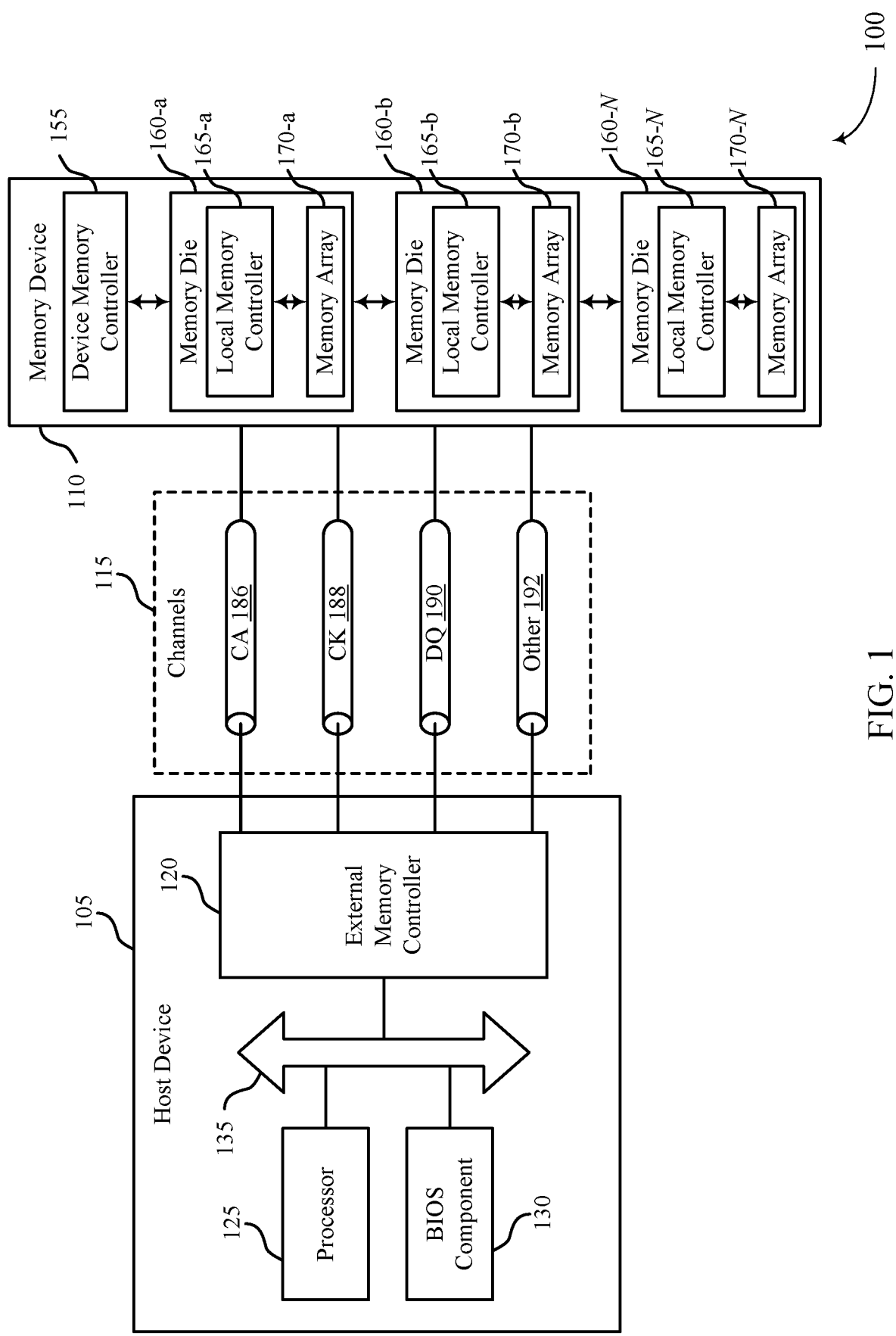
FIG. 1 illustrates an example of a system that supports read operations based on a dynamic reference in accordance with examples as disclosed herein.

When performing a read operation, a memory device may access a memory cell that may output a signal to a sense component based on a value stored by the memory cell. To determine the value stored by the memory cell, the sense component may compare the signal output by the memory cell to a reference voltage. Here, the reference voltage may correspond to a voltage positioned between an expected voltage level of the signal output by a memory cell storing a first logic value and an expected voltage level of the signal output by a memory cell storing a second logic value. Thus, the memory device may determine that the memory cell was storing a first logic value if the signal output by the memory cell is less than the reference voltage. Additionally, the memory device may determine that the memory cell was storing a second logic value if the signal output by the memory cell is greater than the reference voltage. In some cases, the signal output by the memory device may be different than the expected voltage level associated with the value stored by the memory cell. For example, the memory cell may be storing a stuck bit. In another example, the characteristic of the memory cell may change over time, resulting in a corresponding change in the signal output by the memory cell based on the value stored by the memory cell. In some other examples, the signal output by a memory cell may change from the expected value based on other operating conditions (e.g., temperature). Such unintentional changes in the state stored in the memory cell may be referred to as errors. In these cases, comparing the signal output by the memory cell to a single reference voltage may result in one or more errors during the read operation.

In examples described herein, the memory device may compare the signal output by the memory cell to a dynamic reference voltage. For example, the memory device may utilize a capacitive circuit to develop a voltage output by the memory cell before outputting the signal to the sense component. The capacitive circuit may include two separate capacitors (e.g., a first capacitor and a second capacitor). During signal development from the memory cell, the first capacitor and the second capacitor may be shorted together. After the signal development, the first capacitor may be isolated from the second capacitor and the second capacitors from multiple memory cells may be coupled together across a reference voltage bus. Thus, a reference voltage may develop across the reference voltage bus and may be based on an average charge across each of the second capacitors. The memory device may then compare the signal output by each memory cell to the reference voltage on the reference voltage bus and may determine a value stored by each memory cell based on the comparing. By comparing the signal output by each memory cell to a reference voltage that is based on the signal stored by a set of memory cells, the read operation may be associated with a higher reliability when compared to a read operation where the signal output by the memory cell is compared to a static reference voltage.

Features of the disclosure are initially described in the context of systems and dies as described with reference to FIGS. 1-2. Features of the disclosure are described in the context of circuits and a block diagram of a memory device as described with reference to FIGS. 3-7. These and other features of the disclosure are further illustrated by and described with reference to an apparatus diagram and a flowchart that relate to read operations based on a dynamic reference as described with reference to FIGS. 8 and 9.

FIG. 1 illustrates an example of a system 100 that supports read operations based on a dynamic reference in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

When a memory device 110 receives a read command from the host device 105, the memory device 110 may compare the signal output by the memory cell to a dynamic reference voltage. For example, the memory device 110 may utilize a capacitive circuit to develop a voltage output by a memory cell (e.g., in response to the read command) before outputting the signal to a sense component of the memory device 110. The capacitive circuit may include two separate capacitors (e.g., a first capacitor and a second capacitor). During signal development from the memory cell, the first capacitor and second capacitor may be shorted together. After the signal development, the first capacitor may be isolated from the second capacitor and the second capacitors from multiple memory cells may be coupled together across a reference voltage bus. Thus, a reference voltage may develop across the reference voltage bus and may be based on an average charge across each of the second capacitors. The memory device 110 may then compare the signal output by each memory cell to the reference voltage on the reference voltage bus and may determine a value stored by each memory cell based on the comparing. By comparing the signal output by each memory cell to a reference voltage that is based on the signal stored by a set of memory cells, the read operation may be associated with a higher reliability when compared to a read operation where the signal output by the memory cell is compared to a static reference voltage.

Figure 2:
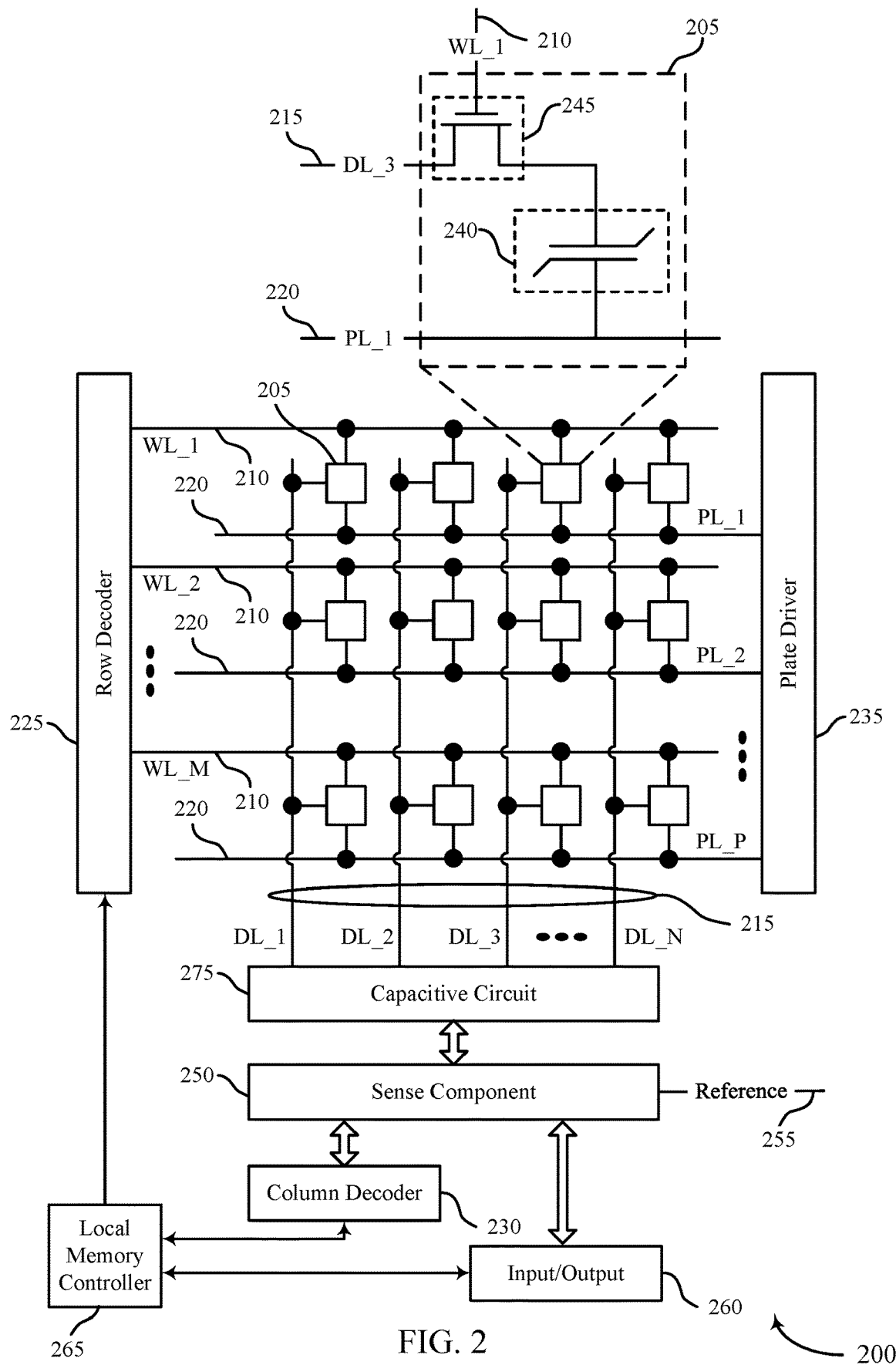
FIG. 2 illustrates an example of a memory die that supports read operations based on a dynamic reference in accordance with examples as disclosed herein.

FIG. 2 illustrates an example of a memory die 200 that supports read operations based on a dynamic reference in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A digit line 215 may be a conductive line that connects the memory cell 205 with a sense component 250 (e.g., by the capacitive circuit 275). In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The capacitive circuit 275 may be an amplifying capacitive circuit and may be used (e.g., during a read operation) to develop a voltage output by a memory cell 205 prior to outputting the voltage to the sense component 250. That is, a voltage from the memory cell 205 may be transferred to the capacitive circuit 275 prior to being output to the sense component 250. In some cases, the capacitive circuit 275 may include more than one capacitor (e.g., two capacitors, three capacitors) in parallel. Here, each capacitor may have a same or similar capacitance value. Thus, a voltage across each capacitor within the capacitive circuit 275 may be the same or similar.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The reference 255 may be provided to the sense component 250 by a reference voltage bus. In some cases, the reference 255 may be a static voltage (e.g., preconfigured, predefined). In some other cases, the reference 255 may be dynamic. For example, during a read operation associated with a set of memory cells 205, each memory cell 205 of the set of memory cells 205 may be selectively coupled with a capacitive circuit 275. In some cases, a signal may develop on the capacitors within the capacitive circuit 275 (e.g., a first capacitor and a second capacitor) while each memory cell 205 is coupled with the capacitive circuit 275. Then, the local memory controller 265 may couple the second capacitor of each capacitive circuit 275 with the reference voltage bus. Thus, the reference 255 on the reference voltage bus may be approximately equal to an average voltage across each of the second capacitors of the capacitive circuits 275. Here, the reference 255 may be dynamic (e.g., based on a stored charge within a set of memory cells 205).

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

Figure 3:
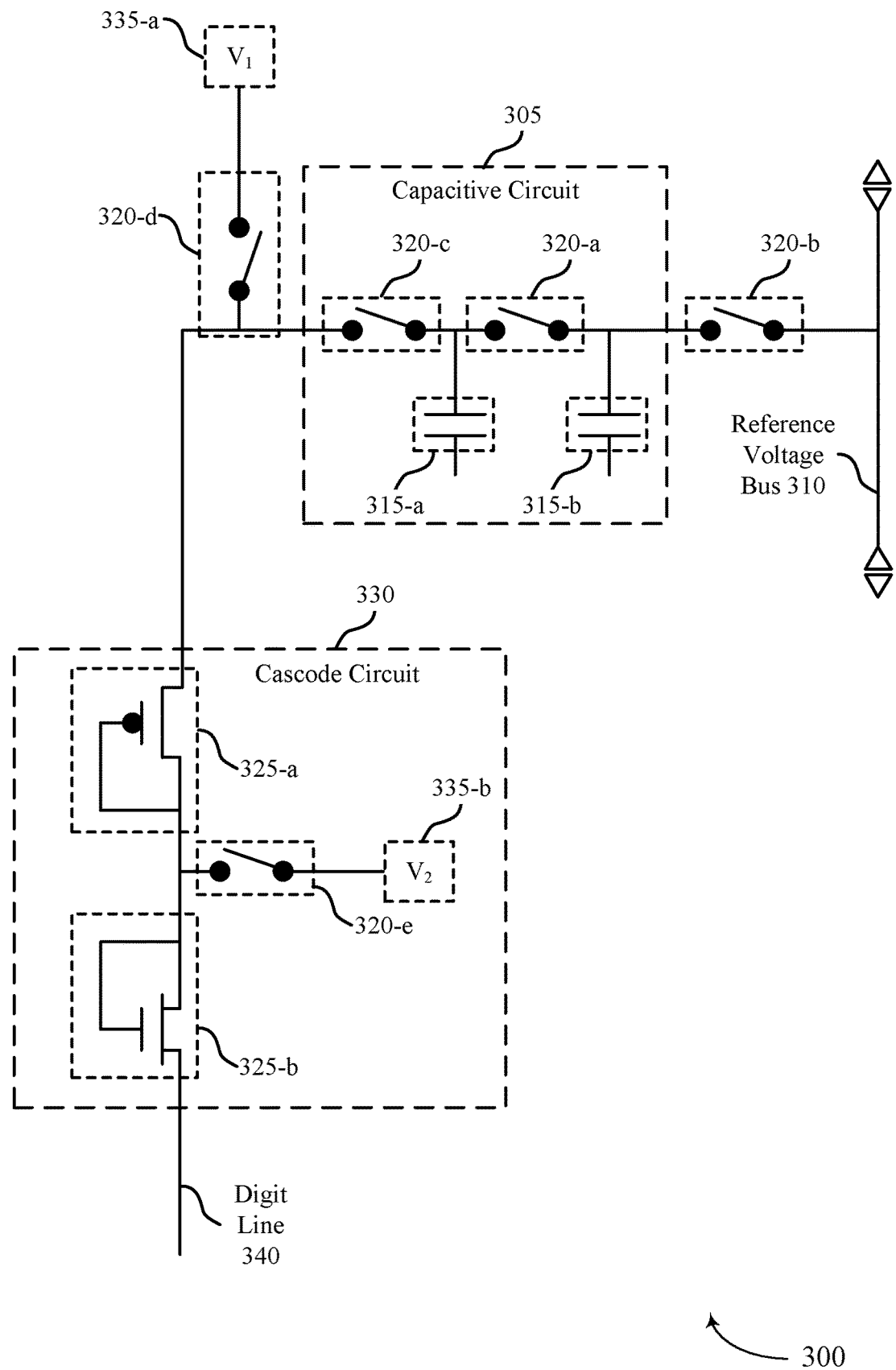
FIGS. 3 through 6 illustrate examples of circuits that supports read operations based on a dynamic reference in accordance with examples as disclosed herein.

FIG. 3 illustrates an example of a circuit 300 that supports read operations based on a dynamic reference in accordance with examples as disclosed herein. In some cases, a memory device as described herein may include aspects of the circuit 300. The circuit 300 may include a capacitive circuit 305, a reference voltage bus 310, and a cascode circuit 330. The capacitive circuit 305 may be selectively coupled with a memory cell by the cascode circuit 330 (e.g., via the digit line 340). Additionally, the capacitive circuit 305 may be selectively coupled with the reference voltage bus 310 by the switching component 320-b.

During a precharge phase of a read operation, the capacitive circuit 305 may be coupled with a voltage source 335-a having a voltage $V_1$ by the switching component 320-d. Additionally, each of the switching components 320-a, 320-b, and 320-c may be closed to enable both of the capacitors 315 and the reference voltage bus 310 to be precharged to the voltage $V_1$. In some cases, the first capacitor 315-a and the second capacitor 315-b may be amplifying capacitors (e.g., AMPCAPs) and may have approximately a same capacitance value. Thus, a voltage across the first and second capacitors 315 may be approximately equal. In some cases, the combined capacitance of the first capacitor 315-a and the second capacitor 315-b may be similar to circuits that includes a single AMPCAP.

During an execution of a read command (e.g., after a precharge phase of the read operation), the capacitive circuit 305 may be selectively coupled with a memory cell via the cascode circuit 330 and the digit line 340. When the capacitive circuit 305 is coupled with the memory cell, the capacitors 315 may store a charge of the memory cell based on being coupled with the memory cell via the cascode circuit 330 and the digit line 340. For example, the first capacitor 315-a and the second capacitor 315-b may store a charge of the memory cell. To charge the capacitors 315 based on the charge of the memory cell, the switching component 320-c and 320-a may be closed to couple the capacitors 315 with the digit line 340 via the cascode circuit 330. Additionally, the switching component 320-b may be open to isolate the reference voltage bus 310 from the capacitors 315 while the capacitors 315 charge based on being coupled with the memory cell.

The cascode circuit 330 may selectively couple the capacitive circuit 305 with the digit line 340 based on the charge of the memory cell. The cascode circuit 330 may include a first cascode 325-a (e.g., a VPCASC) and a second cascode 325-b (e.g., a VNCASC). Additionally, the cascode circuit 330 may include a switching component 320-e to selectively couple the digit line 340 with a voltage source 335-b having a voltage $V_2$ (e.g., a plate line voltage). For example, if the charge of the memory cell is less than a charge related to a first threshold voltage, the first cascode 325-a may isolate the digit line 340 from the capacitive circuit 305. Thus, the charge of the memory cell may not be transferred to the capacitive circuit if the memory cell is storing a charge that is less than the charge related to the first threshold. In some cases, this may prevent a memory cell that is shorted (e.g., is storing a stuck bit) from being coupled with the capacitive circuit. Additionally, if the charge of the memory cell is greater than a charge related to a second threshold voltage, the second cascode 325-b may isolate the digit line 340 from the capacitive circuit 305.

Based on being coupled with the digit line 340, the capacitive circuit 305 may store a charge of the memory cell. That is, the capacitor 315-a and the capacitor 315-b may each store the charge of the memory cell. After a signal is developed on the capacitors 315 (e.g., the charge of the memory cell is stored by the capacitors 315), the switching component 320-a may open to isolate the second capacitor 315-b from the first capacitor 315-a. Then, the switching component 320-b may close to couple the second capacitor 315-b with the reference voltage bus 310. Thus, the charge stored by the capacitor 315-b may be transferred to the reference voltage bus 310.

In some cases, the read operation may be associated with a set of memory cells. Here, each memory cell from the set of memory cells may be selectively coupled with a capacitive circuit 305. Then, each of the second capacitors 315 may be coupled with the reference voltage bus 310. Thus, the voltage on the reference voltage bus 310 may be based on an average charge stored by each of the second capacitors 315, which in turn may be based on an average charge stored by the set of memory cells. In some cases, a ratio of the memory cells within the set of memory cells storing a first value to the memory cells within the set of memory cells storing a second value may be within a known range. For example, the ratio of memory cells storing the first value to the memory cells storing the second value may be within 6:4 and 4:6.

After coupling the second capacitors 315-b with the reference voltage bus 310, a reference voltage may develop on the reference voltage bus 310 (e.g., based on an average charge of the set of memory cells). Then, the capacitive circuit 305 may output a signal (e.g., a charge signal, a voltage signal, or both) from one or both of the capacitors 315 to a sense component that is based on the charge extracted from a memory cell during the read operation. The sense component may compare a charge stored by the first capacitor 315-a and the second capacitor 315-b to the reference voltage (e.g., on the reference voltage bus 310). Based on the comparing, the sense component may output (e.g., to a host device) a set of values stored by the set of memory cells.

Figure 4:
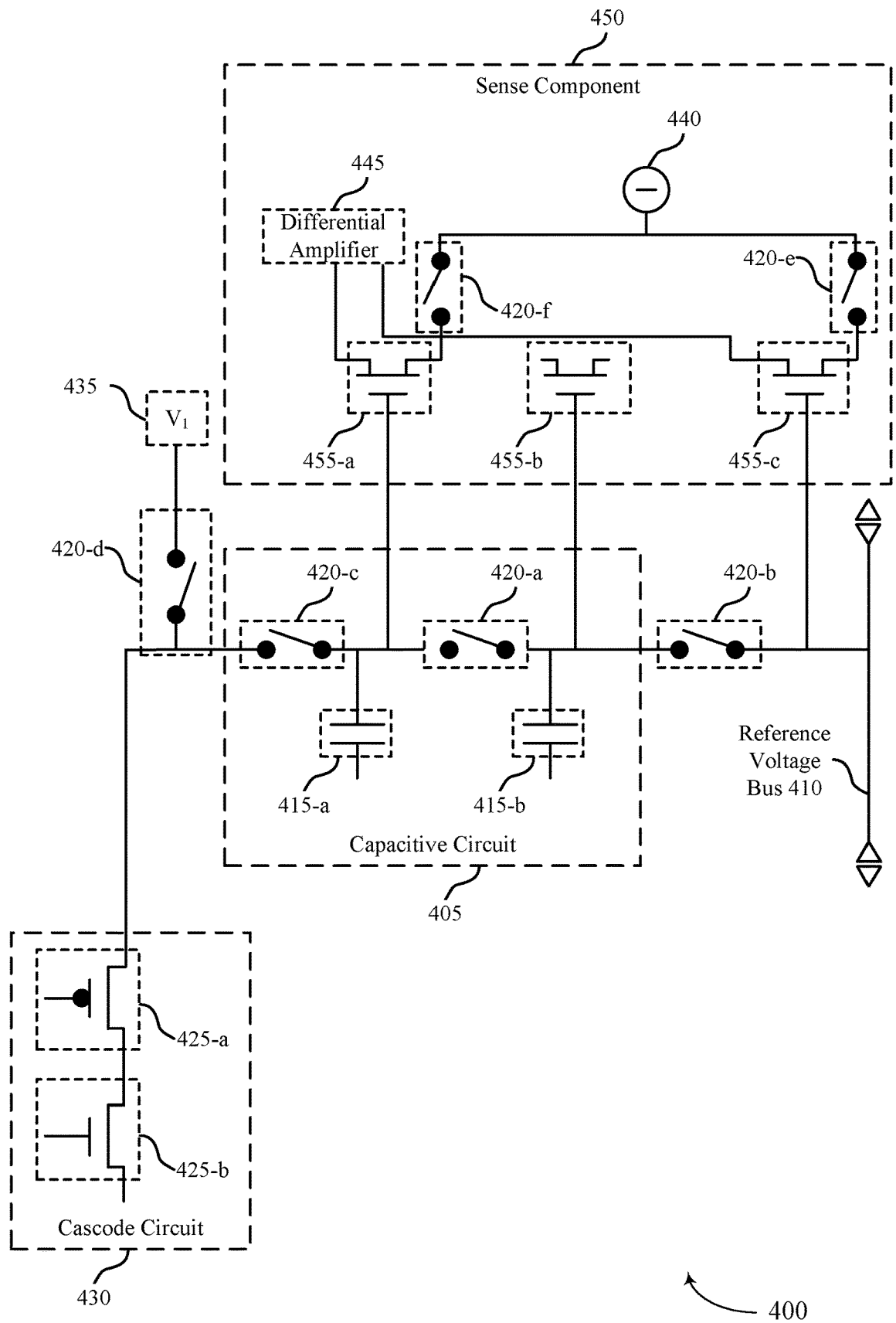

FIG. 4 illustrates an example of a circuit 400 that supports read operations based on a dynamic reference in accordance with examples as disclosed herein. In some cases, a memory device as described herein may include aspects of the circuit 400. Additionally, the circuit 400 may include aspects of the circuit 300 as described with reference to FIG. 3. The circuit 400 may include a capacitive circuit 405, a reference voltage bus 410, a cascode circuit 430, and a sense component 450. As described with reference to FIG. 3, the capacitive circuit 405 may be selectively coupled with a memory cell by the cascode circuit 430 and may be selectively coupled with the reference voltage bus 410 by the switching component 420-b.

As described above, the capacitive circuit 405 may be coupled with a voltage source 435-a having a voltage $V_1$ by the switching component 420-d during a precharge phase of a read operation. Additionally, each of the switching components 420-a, 420-b, and 420-c may be closed to enable both of the capacitors 415 and the reference voltage bus 410 to be precharged to the voltage $V_1$. During an execution of a read command (e.g., after a precharge phase of the read operation), the capacitive circuit 405 may be selectively coupled with a memory cell via the cascode circuit 430. When the capacitive circuit 405 is coupled with the memory cell, the capacitors 415 may store a charge of the memory cell. To charge the capacitors 415 based on the charge of the memory cell, the switching component 420-*c* and 420-*a* may be closed to couple the capacitors 415 with the digit line via the cascode circuit 430. Additionally, the switching component 420-*b* may be open to isolate the reference voltage bus 410 from the capacitors 415 while the capacitors 415 charge based on being coupled with the memory cell.

The cascode circuit 430 may selectively couple the capacitive circuit 405 with the digit line based on the charge of the memory cell. The cascode circuit 430 may include a first cascode 425-*a* (e.g., a VPCASC) and a second cascode 425-*b* (e.g., a VNCASC). For example, if the charge of the memory cell is less than a charge related to a first threshold voltage, the first cascode 425-*a* may isolate the digit line from the capacitive circuit 405. Additionally, if the charge of the memory cell is greater than a charge related to a second threshold voltage, the second cascode 425-*b* may isolate the digit line from the capacitive circuit 405.

Based on being coupled with the digit line, the capacitive circuit 405 may store a charge of the memory cell. That is, the capacitor 415-*a* and the capacitor 415-*b* may each store the charge of the memory cell. After a signal is developed on the capacitors 415 (e.g., the charge of the memory cell is stored by the capacitors 415), the switching component 420-*a* may open to isolate the second capacitor 415-*b* from the first capacitor 415-*a*. Then, the switching component 420-*b* may close to couple the second capacitor 415-*b* with the reference voltage bus 410. Thus, the charge stored by the capacitor 415-*b* may be transferred to the reference voltage bus 410. In some cases, the read operation may be associated with a set of memory cells. Here, each memory cell from the set of memory cells may be selectively coupled with a capacitive circuit 405. Then, each of the second capacitors 415 may be coupled with the reference voltage bus 410. Thus, the voltage on the reference voltage bus 410 may be based on an average charge stored by each of the second capacitors 415, which in turn may be based on an average charge stored by the set of memory cells.

After coupling the second capacitors 415-*b* with the reference voltage bus 410, a reference voltage may develop on the reference voltage bus 410 (e.g., based on an average charge of the set of memory cells). Then, the capacitive circuit 405 may output a signal (e.g., a charge signal, a voltage signal, or both) from the capacitors 415 to a sense component 450 that is based on the charge extracted from a memory cell during the read operation. The sense component 450 may include a set of transistors 455 (e.g., transistor 455-*a*, transistor 455-*b*, and transistor 455-*c*), a current generator 440, and a differential amplifier 445. In some cases, the differential amplifier 445 may compare an output of the first transistor 455-*a* and each of the remaining transistors 455 of the sense component 450. In some cases, the gate of the first transistor 455-*a* may be coupled with the first capacitor 415-*a*. Additionally, the gate of the remaining transistors 455 (e.g., the transistor 455-*b* and the transistor 455-*c*) may be coupled with the reference voltage bus 410.

In some cases, the reference voltage on the reference voltage bus 410 may be adjusted prior to being directed to the gate of each transistor 455. Thus, the signal on the capacitor 415-*a* may be compared to more than one reference voltage. For example, the reference voltage associated with the transistor 455-*c* may be equal to the reference voltage on the reference voltage bus 410. Additionally, the reference voltage associated with the transistor 455-*b* may be decreased or increased when compared to the reference voltage on the reference voltage bus 410 (e.g., by the capacitor 415-*b*). In another example, the voltage across the capacitor 415-*a* may be adjusted prior to being coupled with the gate of the first transistor 455-*a*. In either case, multiple sets of possible values may be generated for each read operation (e.g., based on the multiple different reference voltages). In some cases, the sense component 450 may output the multiple candidate values to error control circuitry, which may identify one of the candidate values to output to the host device based on one or more error control operations.

Figure 5:
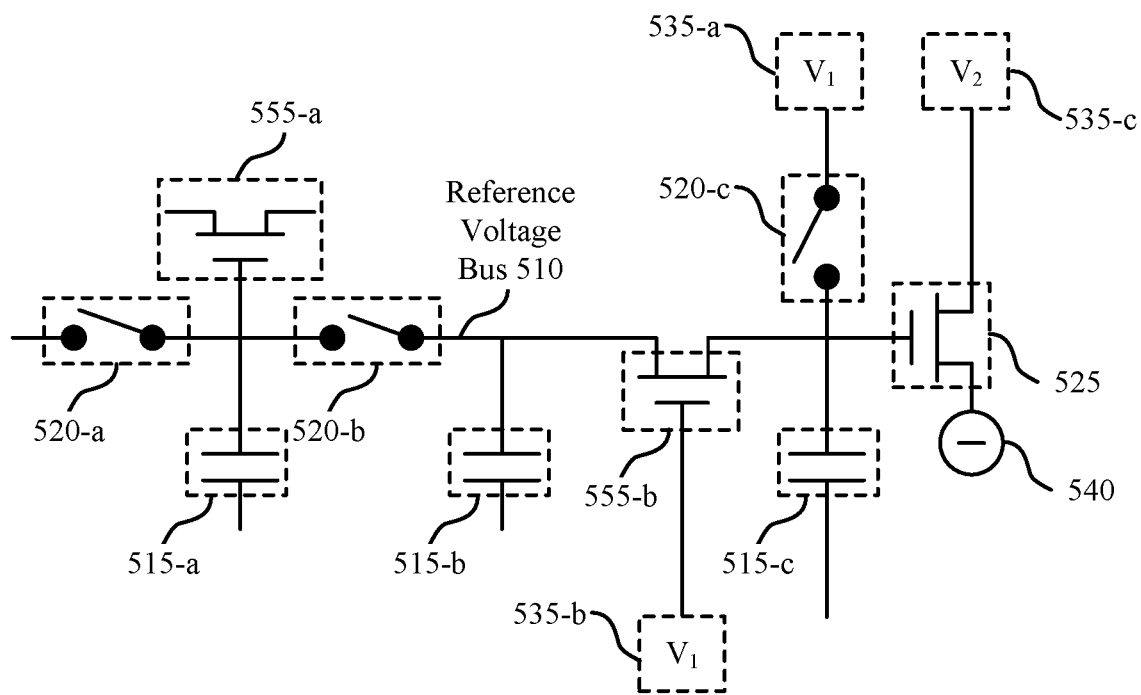

FIG. 5 illustrates an example of a circuit 500 that supports read operations based on a dynamic reference in accordance with examples as disclosed herein. In some cases, a memory device as described herein may include aspects of the circuit 500. Additionally, the circuit 500 may include aspects of the circuit 300 as described with reference to FIGS. 3 and 4. The circuit 500 may include a second capacitor 515-*a* (e.g., as described with reference to FIGS. 3 and 4), a transistor 555-*a* (e.g., that is part of a sense component as described with reference to FIG. 4), a reference voltage bus 510, and a parasitic capacitance associated with the reference voltage bus 510 indicated by the capacitor 515-*b*. The circuit 500 may illustrate an example circuit for accounting for a parasitic capacitance associated with the reference voltage bus 510.

During a precharge phase of a read operation, the switching component 520-*a* may be closed (e.g., to couple the second capacitor 515-*a* with a first capacitor of the capacitive circuit), the switching component 520-*b* may be closed (e.g., to precharge the reference voltage bus 510), and the switching component 520-*c* may be closed. In some cases, the reference voltage bus 510 may be precharged to a precharge voltage based on the switching component 520-*b* being closed and coupling the reference voltage bus 510 with the capacitance circuit associated with each memory cell (e.g., of a set of memory cells). That is, the capacitor 515-*b* may be precharged to the precharge voltage. During the precharge phase, the voltage source 535-*a* having a voltage level $V_1$, may additionally be used to precharge the reference voltage bus 510 to the voltage level $V_1$. In some cases, $V_1$ may be approximately equal to a precharge voltage (e.g., VHSA) plus a threshold voltage. In some cases, the precharging may charge the capacitor 515-*c* to the threshold voltage.

In the example of the circuit 500, the capacitor 515-*c* may have a capacitance that is approximately equal to the capacitance of the second capacitor 515-*a* times the quantity of memory cells being read during the read operation (e.g., 256). Thus, charging the capacitor 515-*c* to the threshold voltage may enable an impedance matching based on the quantity of memory cells being read during the read operation. The circuit 500 may additionally illustrate a third cascode 525 that is coupled with a voltage source 535-*c* having a voltage V2 and a current generator 540. In some cases, the voltage source 535-*c* may apply a precharge voltage to the cascode 525. The cascode 525 may enable the circuit 500 to integrate a signal developed on the reference voltage bus 510 and avoid the parasitic capacitance associated with the reference voltage bus 510.

During the read operation (e.g., after the precharge phase), the voltage source 535-*b* may apply a voltage to the transistor 555-*b* to couple the transistor 555-*c* with the reference voltage bus 510. Here, the parasitic capacitance of the reference voltage bus 510 indicated by the capacitor 515-b may be accounted for based on precharging the reference voltage bus 510 to the precharge voltage plus the threshold voltage.

Figure 6:
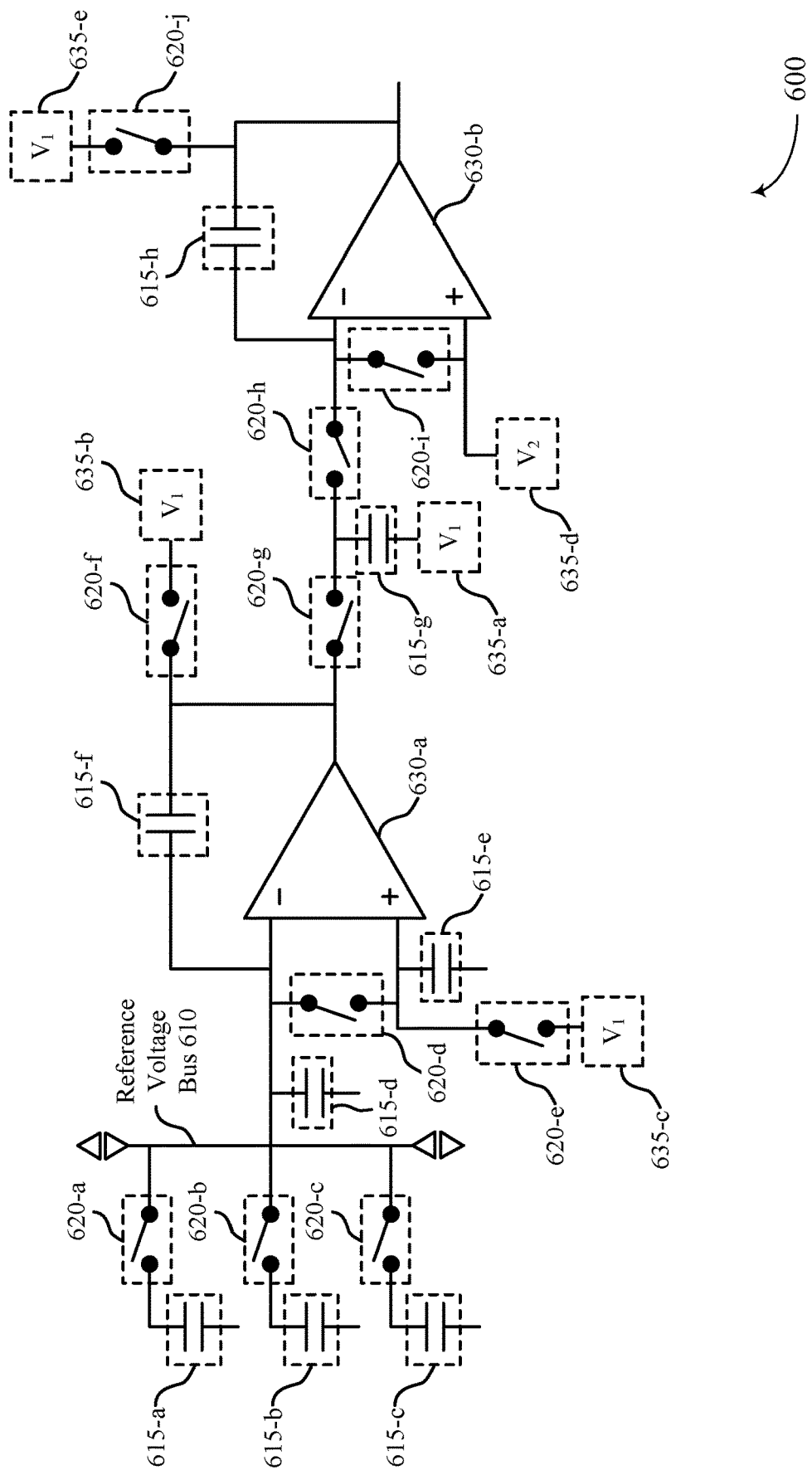

FIG. 6 illustrates an example of a circuit 600 that supports read operations based on a dynamic reference in accordance with examples as disclosed herein. In some cases, a memory device as described herein may include aspects of the circuit 600. Additionally, the circuit 600 may include aspects of the circuits as described with reference to FIGS. 3 and 4. The circuit 600 may include a second capacitors 615-a, 615-b, and 615-c (e.g., as described with reference to FIGS. 3 and 4), operational amplifiers 630, a reference voltage bus 610, and a parasitic capacitance associated with the reference voltage bus 610 indicated by the capacitor 615-d. The circuit 600 may illustrate an example circuit for accounting for a parasitic capacitance associated with the reference voltage bus 610.

Each of the second capacitors 615-a, 615-b, and 615-c may be associated with a separate capacitive circuit and memory cell. Additionally, the second capacitors 615-a, 615-b, and 615-c may be selectively coupled with the reference voltage bus 610 by switching components 620-a, 620-b, and 620-c, respectively. The reference voltage bus 610 may be associated with a parasitic capacitance illustrated by the capacitor 615-d. In order to mitigate the parasitic capacitance associated with the reference voltage bus 610, the circuit 600 may additionally include a first operational amplifier 630-a and a second operational amplifier 630-b. The first operational amplifier 630-a may be coupled with the reference voltage bus 610, switching components 620-d and 620-e, and capacitors 615-e and 615-f. Additionally, the second operational amplifier 630-b may be coupled with capacitors 615-g and 615-h, switching components 620-g, 620-h, and 620-i, and voltage sources 635-a and 635-d. In some cases, the voltage sources 635 having a voltage of $V_1$ may correspond to precharge voltage sources and the voltage sources 635 having a voltage of $V_2$ may correspond to supply voltage sources. In some examples, the operational amplifiers 630 may enable the circuit 600 to integrate a signal developed on the reference voltage bus 610 and avoid the parasitic capacitance associated with the reference voltage bus 610.

Figure 7:
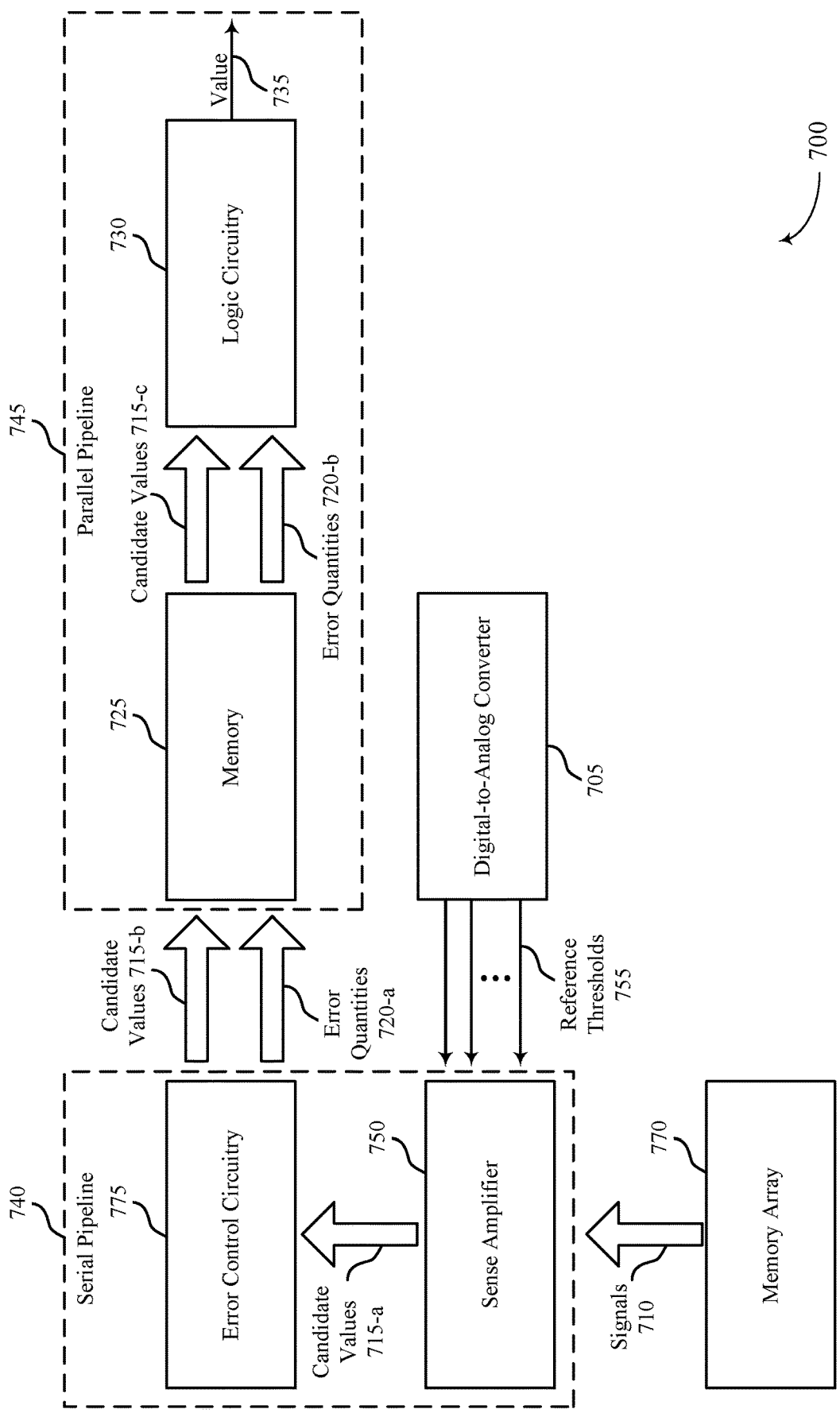
FIG. 7 illustrates an example of a block diagram of a memory device that supports read operations based on a dynamic reference in accordance with examples as disclosed herein.

FIG. 7 illustrates an example of a block diagram of a memory device 700 that supports read operations based on a dynamic reference in accordance with examples as disclosed herein. The memory device 700 may be an example of a memory device as described with reference to FIG. 1. In some cases, the memory device 700 may include one or more components as described with reference to FIGS. 1 through 6. For example, the memory array 770 may be an example of a memory array 170, the reference thresholds 755 may be examples of the references 255, and the sense amplifier 750 may be an example of the sense component 250. The memory device 700 may also include error control circuitry 775, logic circuitry 730, a digital-to-analog converter 705, and memory 725.

The digital-to-analog converter 705 may be a peripheral digital-to-analog converter 705 or a complementary metal-oxide-semiconductor (CMOS) under array (CuA). In some cases, the digital-to-analog converter 705 may be integrated with another component. For example, the digital-to-analog converter 705 may be integrated with a device memory controller or local memory controller as described with reference to FIGS. 1 and 2. During a read operation, the digital-to-analog converter 705 may supply the set of reference thresholds 755 to the memory array and sense amplifier 750 (e.g., as described with reference to FIG. 4). Each reference threshold 755 may correspond to a different voltage. For example, the reference thresholds 755 may include a first voltage (e.g., 1.4V), a second voltage (e.g., 1.5 V), and a third voltage (e.g., 1.6V). In some cases, the digital-to-analog converter 705 may supply a set of reference thresholds 755 (e.g., predefined reference voltages) to the memory array and sense amplifier 750. For example, the digital-to-analog converter 705 may dynamically adjust a set of reference thresholds 755 supplied to the memory array and sense amplifier 750 (e.g., based on the voltage on the reference voltage bus).

In some cases, the memory device 700 may perform a read operation. For example, the memory device 700 may receive a read command (e.g., from a host device as described with reference to FIG. 1) and perform the read operation in response. In some cases, the read command may include an indication of one or more memory cells within the memory array 770 to be read during an execution of the read operation. The memory device 700 may access the indicated memory cells in the memory array 770. Based on accessing the memory cells in the memory array 770, the memory array 770 may output signals 710 to the sense amplifier 750. For example, the memory array 770 may output a signal 710 associated with each accessed memory cell.

The sense amplifier 750 may receive the signals 710 from the memory array 770. The sense amplifier 750 may amplify the signals 710 and compare the signals 710 to the reference thresholds 755 supplied by the digital-to-analog converter 705. Based on comparing the signals 710 to each of the reference thresholds 755, the sense amplifier 750 may generate the candidate values 715-a. For example, the sense amplifier 750 may compare the signals 710 to a first reference threshold 755 and generate a first candidate value 715-a. Additionally, the sense amplifier 750 may compare the signals 710 to one or more additional reference thresholds 755 to generate additional candidate values 715-a. In some examples, the sense amplifier 750 may compare the signals 710 to each of the reference thresholds 755 in parallel. That is, the sense amplifier 750 may compare the signals 710 to the first reference threshold 755 during a time period that at least partially overlaps with a time period during which the sense amplifier 750 compares the signals 710 to the one or more additional reference thresholds 755. In some other examples, the sense amplifier 750 may compare the signals 710 to each of the reference thresholds 755 serially. That is, the sense amplifier 750 may compare the signals 710 to the first reference threshold 755 prior to comparing the signals 710 to the one or more additional reference thresholds 755.

In some instances, the sense amplifier 750 may generate candidate values 715-a that each contain the same values. For example, when the sense amplifier 750 compares the signals 710 to the different reference thresholds 755, the sense amplifier 750 may generate a set of identical candidate values 715-a. In some other instances, the sense amplifier 750 may generate one or more of the candidate values 715-a that are different than another candidate value 715-a. That is, when the sense amplifier 750 compares the signals 710 to a first reference threshold 755, the sense amplifier 750 may generate a different candidate value 715-a than when the sense amplifier 750 compares the signals 710 to a second reference threshold 755.

The sense amplifier 750 may output the candidate values 715-a to the error control circuitry 775. The error control circuitry 775 may perform an error control operation on each of the candidate values 715-*a*. Thus, the error control circuitry 775 may detect an error quantity 720 within each of the candidate values 715-*a*. In some cases, the error control circuitry 775 may be configured to detect up to two errors within a candidate value 715-*a*. Thus, in a case that the candidate value 715-*a* contains more than two errors, the error control circuitry 775 may detect zero, one, or two errors within the candidate value 715-*a*. In some other cases, the error control circuitry 775 may be configured to detect more than two errors within the candidate values 715-*a*. In either case, the error control circuitry 775 may output the candidate values 715-*b* (e.g., corresponding to the candidate values 715-*a*) and error quantities 720-*a*. For example, the error control circuitry 775 may output an error quantity 720-*a* associated with each of the candidate values 715-*b*.

The memory 725 may receive the candidate values 715-*b* and the error quantities 720-*a* from the error control circuitry 775. The memory 725 may include one or more registers to temporarily store the candidate values 715-*b* and the corresponding error quantities 720-*a*. The memory 725 may be an example of any memory technology capable of storing information. In some cases, the memory 725 may be an example of a scratch memory that may be used for the storage of temporary data. In some examples, such a scratch memory may be less reliable than other types of memory and may not include a backup. In some cases, the memory 725 may be erased at periodic intervals.

The sense amplifier 750 and the error control circuitry 775 may make up a serial pipeline 740. For example, the sense amplifier 750 may output each of the candidate values 715-*a* to the error control circuitry 775 serially. Here, the error control circuitry 775 may perform the error control operation on each of the candidate values 715-*a* serially. For example, the error control circuitry 775 may receive a first candidate value 715-*a* from the sense amplifier 750 and perform a first error control operation to detect a first error quantity 720-*a* associated with the first candidate value 715-*a*. The error control circuitry 775 may output the first candidate value 715-*a* and first error quantity 720-*a* to the memory 725 for storage. The error control circuitry 775 may then receive a second candidate value 715-*a* from the sense amplifier 750 and perform a second error control operation.

If the error control circuitry 775 performs an error control operation on one of the candidate values 715-*a* and detects that the candidate value contains no errors, the error control circuitry 775 may output that candidate value 715-*a* (e.g., to an input/output as described with reference to FIG. 2). In this example, the memory device 700 may complete the execution of the read operation by communicating the value (e.g., corresponding to the candidate value 715-*a* containing no errors) to the host device. Here, the error control circuitry 775 may not continue to perform error control operations on the remaining candidate values 715-*a* and output the candidate values 715-*b* and error quantities 720-*a* to the memory 725. In some cases, this may conserve power when compared to a memory device 700 that continues performing error control operations on the remaining candidate values 715-*a* after detecting a candidate value 715-*a* with no errors.

In a case that the error control circuitry 775 fails to identify a candidate value 715-*a* with no errors, the error control circuitry 775 may communicate the candidate values 715-*b* and error quantities 720-*a* corresponding to each of the candidate values 715-*a* to the memory 725. The memory 725 may in turn communicate the candidate values 715-*c* and error quantities 720-*b* to the logic circuitry 730. The logic circuitry 730 may determine a value 735 stored by the memory cells within the memory array 770 based on the candidate values 715-*c* and the error quantities 720-*b*. For example, the logic circuitry 730 may determine the value 735 based on the candidate value 715-*c* associated with a lowest detected error quantity 720-*b*. Additionally, the logic circuitry 730 may determine the value 735 based on a mode value of the candidate value 715-*c* (e.g., a most occurrent value within the candidate values 715-*c*). The logic circuitry 730 may output the value 735. For example, the logic circuitry 730 may output the value 735 to input/output (e.g., as described with reference to FIG. 2). The memory 725 and the logic circuitry 730 may correspond to a parallel pipeline 745. That is, the memory 725 may communicate the candidate values 715-*c* and error quantities 720-*b* to the logic circuitry 730 in parallel (e.g., during a same or similar time interval s).

In some cases, the memory device 700 may perform an error correction operation on the value 735. For example, the memory device 700 may error correction circuitry (e.g., integrated with the error control circuitry 775, distinct from the error control circuitry 775). In this case, the memory device may correct one or more errors detected within the value 735 (e.g., prior to transmitting the value 735 to the host device).

Figure 8:
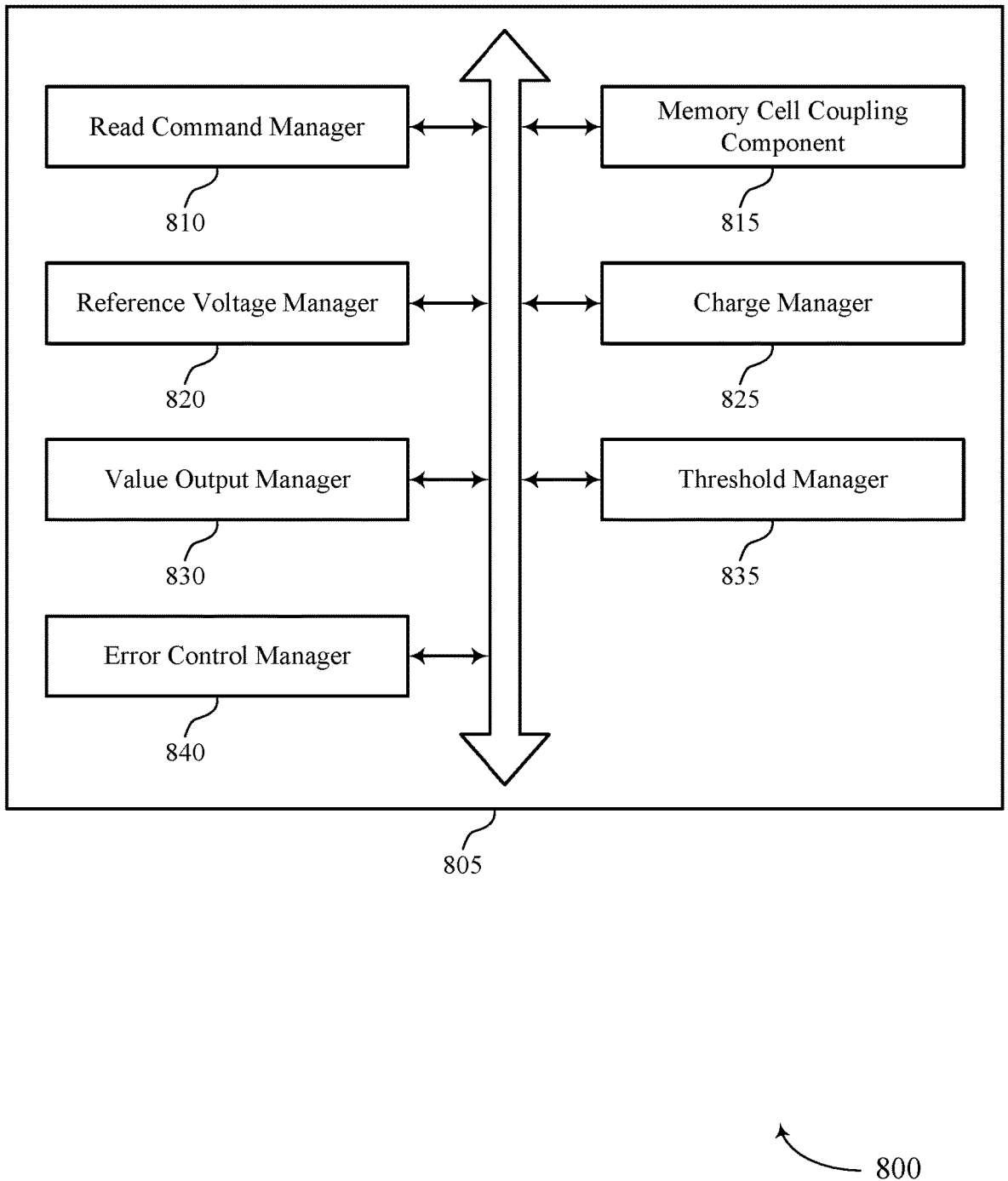
FIG. 8 shows a block diagram of a memory device that supports read operations based on a dynamic reference in accordance with examples as disclosed herein.

FIG. 8 shows a block diagram 800 of a memory device 805 that supports read operations based on a dynamic reference in accordance with examples as disclosed herein. The memory device 805 may be an example of aspects of a memory device as described with reference to FIGS. 1 through 7. The memory device 805 may include a read command manager 810, a memory cell coupling component 815, a reference voltage manager 820, a charge manager 825, a value output manager 830, a threshold manager 835, and an error control manager 840. Each of these modules may communicate, directly or indirectly, with one another (e.g., via one or more buses).

The read command manager 810 may receive, from a host device, a read command for a set of memory cells where each memory cell of the set of memory cells is associated with a capacitive circuit including a first capacitor and a second capacitor.

The memory cell coupling component 815 may selectively couple each capacitive circuit with a respective memory cell based on receiving the read command. In some examples, the memory cell coupling component 815 may couple the first capacitor with the second capacitor of each capacitive circuit based on receiving the read command.

The reference voltage manager 820 may couple the second capacitor of each capacitive circuit to a reference voltage bus based on selectively coupling each capacitive circuit with the respective memory cell. In some examples, the reference voltage manager 820 may generate the reference voltage on the reference voltage bus based on coupling the second capacitor of each capacitive circuit to the reference voltage bus after charging the first and second capacitors of each capacitive circuit to the voltage that is based on the value stored by each memory cell of the set of memory cells. In some cases, the reference voltage manager 820 may precharge the first and second capacitors of each capacitive circuit to a precharge voltage, where coupling the second capacitor of each capacitive circuit to the reference voltage bus is based on precharging the first and second capacitors of each capacitive circuit to the precharge voltage.

In some instances, the reference voltage manager 820 may precharge the reference voltage bus to a precharge voltage based on a parasitic capacitance associated with the reference voltage bus, where coupling the second capacitor of each capacitive circuit to the reference voltage bus is based on precharging the reference voltage bus to the precharge voltage. In some cases, the reference voltage is based on an average voltage of each of the second capacitors after the charging the second capacitors to the voltage, where charging the second capacitors to the voltage is based on the value stored by each memory cell of the set of memory cells.

The charge manager 825 may compare a charge stored by the first capacitor and the second capacitor of each capacitive circuit to a reference voltage on the reference voltage bus based on coupling the second capacitor of each capacitive circuit with the reference voltage bus. In some examples, the charge manager 825 may charge, based on selectively coupling the first and second capacitors of each capacitive circuit with the associated memory cell, the first and second capacitors of each capacitive circuit to a voltage based on a value stored by the associated memory cell. In some examples, the charge manager 825 may isolate the second capacitor from the first capacitor after charging the first and second capacitors of each capacitive circuit to the voltage, where selectively coupling the second capacitor of each capacitive circuit to the reference voltage bus is based on isolating the second capacitor from the first capacitor.

In some cases, the charge manager 825 may compare the charge stored by the first and second capacitors of each capacitive circuit to one or more additional reference voltages based on adjusting the reference voltage on the reference voltage bus, where outputting the set of values stored by the set of memory cells is based on comparing the charge stored by the first and second capacitors of each capacitive circuit to the one or more additional reference voltages. In some instances, the charge manager 825 may adjust a charge stored by the first capacitor of each capacitive circuit based on comparing the charge stored by the first and second capacitors of each capacitive circuit to the reference voltage. In some examples, the charge manager 825 may compare the adjusted charge stored by the first capacitor of each capacitive circuit to the reference voltage on the reference voltage bus based on adjusting the charge stored by the first capacitor of each capacitive circuit, where outputting the set of values stored by the set of memory cells is based on comparing the adjusted charge stored by the first capacitor of each capacitive circuit to the reference voltage on the reference voltage bus.

The value output manager 830 may output, to the host device, a set of values stored by the set of memory cells based on the comparing.

The threshold manager 835 may determine, for each memory cell from the set of memory cells, whether a voltage associated with the memory cell is less than a threshold voltage, where selectively coupling the first and second capacitors of each capacitive circuit with the associated memory cell of the set of memory cells is based on whether the voltage associated with the associated memory cell is less than the threshold voltage. In some examples, the threshold manager 835 may isolate a first memory cell of the set of memory cells from the first and second capacitors associated with the first memory cell based on determining that the first memory cell is associated with a voltage that is less than the threshold voltage.

The error control manager 840 may perform an error control operation on a first set of values associated with the reference voltage and one or more additional sets of values each associated with the one or more additional reference voltages, where outputting the set of values stored by the set of memory cells is based on performing the error control operation.

Figure 9:
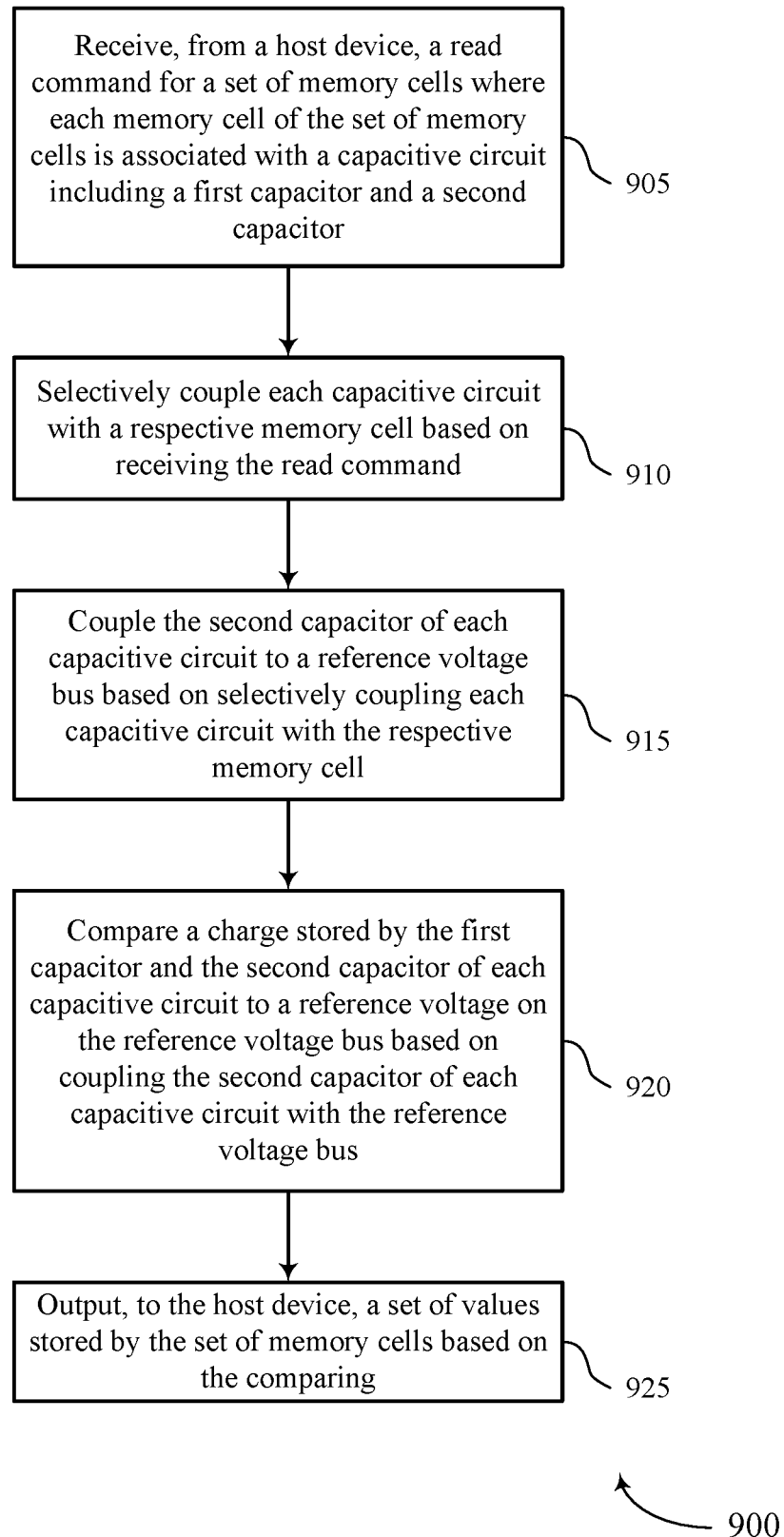
FIG. 9 shows a flowchart illustrating a method or methods that support read operations based on a dynamic reference in accordance with examples as disclosed herein.

FIG. 9 shows a flowchart illustrating a method or methods 900 that supports read operations based on a dynamic reference in accordance with examples as disclosed herein. The operations of method 900 may be implemented by a memory device or its components as described herein. For example, the operations of method 900 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 905, the memory device may receive, from a host device, a read command for a set of memory cells where each memory cell of the set of memory cells is associated with a capacitive circuit including a first capacitor and a second capacitor. The operations of 905 may be performed according to the methods described herein. In some examples, aspects of the operations of 905 may be performed by a read command manager as described with reference to FIG. 8.

At 910, the memory device may selectively couple each capacitive circuit with a respective memory cell based on receiving the read command. The operations of 910 may be performed according to the methods described herein. In some examples, aspects of the operations of 910 may be performed by a memory cell coupling component as described with reference to FIG. 8.

At 915, the memory device may couple the second capacitor of each capacitive circuit to a reference voltage bus based on selectively coupling each capacitive circuit with the respective memory cell. The operations of 915 may be performed according to the methods described herein. In some examples, aspects of the operations of 915 may be performed by a reference voltage manager as described with reference to FIG. 8.

At 920, the memory device may compare a charge stored by the first capacitor and the second capacitor of each capacitive circuit to a reference voltage on the reference voltage bus based on coupling the second capacitor of each capacitive circuit with the reference voltage bus. The operations of 920 may be performed according to the methods described herein. In some examples, aspects of the operations of 920 may be performed by a charge manager as described with reference to FIG. 8.

At 925, the memory device may output, to the host device, a set of values stored by the set of memory cells based on the comparing. The operations of 925 may be performed according to the methods described herein. In some examples, aspects of the operations of 925 may be performed by a value output manager as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for receiving, from a host device, a read command for a set of memory cells where each memory cell of the set of memory cells is associated with a capacitive circuit including a first capacitor and a second capacitor, selectively coupling each capacitive circuit with a respective memory cell based on receiving the read command, coupling the second capacitor of each capacitive circuit to a reference voltage bus based on selectively coupling each capacitive circuit with the respective memory cell, comparing a charge stored by the first capacitor and the second capacitor of each capacitive circuit to a reference voltage on the reference voltage bus based on coupling the second capacitor of each capacitive circuit with the reference voltage bus, and outputting, to the host device, a set of values stored by the set of memory cells based on the comparing.

Some cases of the method 900 and the apparatus described herein may further include operations, features, means, or instructions for charging, based on selectively coupling the first and second capacitors of each capacitive circuit with the associated memory cell, the first and second capacitors of each capacitive circuit to a voltage based on a value stored by the associated memory cell, and generating the reference voltage on the reference voltage bus based on coupling the second capacitor of each capacitive circuit to the reference voltage bus after charging the first and second capacitors of each capacitive circuit to the voltage that may be based on the value stored by each memory cell of the set of memory cells.

In some instances of the method 900 and the apparatus described herein, the reference voltage may be based on an average voltage of each of the second capacitors after the charging the second capacitors to the voltage, where charging the second capacitors to the voltage may be based on the value stored by each memory cell of the set of memory cells.

Some examples of the method 900 and the apparatus described herein may further include operations, features, means, or instructions for isolating the second capacitor from the first capacitor after charging the first and second capacitors of each capacitive circuit to the voltage, where selectively coupling the second capacitor of each capacitive circuit to the reference voltage bus may be based on isolating the second capacitor from the first capacitor.

Some cases of the method 900 and the apparatus described herein may further include operations, features, means, or instructions for determining, for each memory cell from the set of memory cells, whether a voltage associated with the memory cell may be less than a threshold voltage, where selectively coupling the first and second capacitors of each capacitive circuit with the associated memory cell of the set of memory cells may be based on whether the voltage associated with the associated memory cell may be less than the threshold voltage.

Some instances of the method 900 and the apparatus described herein may further include operations, features, means, or instructions for isolating a first memory cell of the set of memory cells from the first and second capacitors associated with the first memory cell based on determining that the first memory cell may be associated with a voltage that may be less than the threshold voltage.

Some examples of the method 900 and the apparatus described herein may further include operations, features, means, or instructions for coupling the first capacitor with the second capacitor of each capacitive circuit based on receiving the read command, and precharging the first and second capacitors of each capacitive circuit to a precharge voltage, where coupling the second capacitor of each capacitive circuit to the reference voltage bus may be based on precharging the first and second capacitors of each capacitive circuit to the precharge voltage.

Some cases of the method 900 and the apparatus described herein may further include operations, features, means, or instructions for precharging the reference voltage bus to a precharge voltage based on a parasitic capacitance associated with the reference voltage bus, where coupling the second capacitor of each capacitive circuit to the reference voltage bus may be based on precharging the reference voltage bus to the precharge voltage.

Some instances of the method 900 and the apparatus described herein may further include operations, features, means, or instructions for comparing the charge stored by the first and second capacitors of each capacitive circuit to one or more additional reference voltages based on adjusting the reference voltage on the reference voltage bus, where outputting the set of values stored by the set of memory cells may be based on comparing the charge stored by the first and second capacitors of each capacitive circuit to the one or more additional reference voltages.

Some examples of the method 900 and the apparatus described herein may further include operations, features, means, or instructions for performing an error control operation on a first set of values associated with the reference voltage and one or more additional sets of values each associated with the one or more additional reference voltages, where outputting the set of values stored by the set of memory cells may be based on performing the error control operation.

Some cases of the method 900 and the apparatus described herein may further include operations, features, means, or instructions for adjusting a charge stored by the first capacitor of each capacitive circuit based on comparing the charge stored by the first and second capacitors of each capacitive circuit to the reference voltage, and comparing the adjusted charge stored by the first capacitor of each capacitive circuit to the reference voltage on the reference voltage bus based on adjusting the charge stored by the first capacitor of each capacitive circuit, where outputting the set of values stored by the set of memory cells may be based on comparing the adjusted charge stored by the first capacitor of each capacitive circuit to the reference voltage on the reference voltage bus.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory cell and a capacitive circuit configured to selectively couple with the memory cell and configured to develop a signal of the memory cell during an access operation. The capacitive circuit may include a first capacitor configured to selectively couple with an access line associated with the memory cell, a second capacitor configured to selectively couple with the first capacitor, a switching component coupled with the first capacitor and the second capacitor and configured to selectively couple with the first capacitor and the second capacitor, a reference voltage bus configured to selectively couple with the second capacitor during the access operation, and a sense component configured to compare a charge stored by the first capacitor and the second capacitor with a reference voltage on the reference voltage bus.

Some examples of the apparatus may include a second switching component coupled with the second capacitor and the reference voltage bus and configured to selectively couple the second capacitor with the reference voltage bus and transfer a voltage from the second capacitor to the reference voltage bus during the access operation, where the reference voltage may be based on transferring the voltage from the second capacitor to the reference voltage bus.

Some cases of the apparatus may include a cascode circuit coupled with the capacitive circuit and the memory cell, the cascode circuit configured to selectively isolate the memory cell from the capacitive circuit during the access operation when a voltage associated with the memory cell may be less than a threshold voltage associated with the cascode circuit.

In some instances, the cascode circuit may further include a first transistor coupled with the capacitive circuit and a second transistor of the cascode circuit, the first transistor configured to selectively isolate the memory cell from the capacitive circuit during the access operation when the voltage associated with the memory cell may be less than the threshold voltage.

In some examples, the second transistor may be coupled with the first transistor and the memory cell, and the second transistor may be configured to selectively isolate the memory cell from the capacitive circuit during the access operation when the voltage associated with the memory cell may be greater than a second threshold voltage.

In some cases, the capacitive circuit further may include a third switching component coupled with the first capacitor and the cascode circuit and configured to selectively couple the first capacitor and the second capacitor with the cascode circuit during at least a portion of a duration when the signal of the memory cell develops as part of the access operation.

Some instances of the apparatus may include a second cascode circuit coupled with the reference voltage bus and configured to precharge the reference voltage bus to a precharge voltage based on a parasitic capacitance associated with the reference voltage bus, where the reference voltage may be based on precharging the reference voltage bus to the precharge voltage.

Some examples of the apparatus may include an amplifier circuit coupled with the reference voltage bus and configured to precharge the reference voltage bus to a precharge voltage based on a parasitic capacitance associated with the reference voltage bus, where the reference voltage may be based on precharging the reference voltage bus to the precharge voltage.

Some cases of the apparatus may include a third cascode circuit coupled with the reference voltage bus including a third transistor and configured to integrate a signal on the reference voltage bus based on a parasitic capacitance associated with the reference voltage bus, where the reference voltage may be based on integrating the signal on the reference voltage bus.

In some instances, a capacitance of the first capacitor may be equal to a capacitance of the second capacitor.

In some examples, the sense component may include a set of transistors, each transistor of the set of transistors associated with a different reference voltage including at least the reference voltage, where each transistor of the set of transistors may be configured to compare the charge stored by the first capacitor and the second capacitor with the different reference voltages.

An apparatus is described. The apparatus may include a set of memory cells and a set of capacitive circuits each configured to develop a signal of a memory cell from the set of memory cells during an access operation. In some examples, each capacitive circuit may include a first capacitor configured to selectively couple with an access line associated with the memory cell, and a second capacitor configured to selectively couple with the first capacitor. Each capacitive circuit may further include a switching component coupled with the first capacitor and the second capacitor and configured to selectively couple with the first capacitor and the second capacitor. The apparatus may further include a reference voltage bus configured to selectively couple with the second capacitor of each capacitive circuit of the set of capacitive circuits during the access operation, and a sense component configured to compare a charge stored by the first and second capacitors of each capacitive circuit with a reference voltage on the reference voltage bus.

Some examples of the apparatus may include a set of second switching components each coupled with the second capacitor of each capacitive circuit and the reference voltage bus and configured to selectively couple each second capacitor with the reference voltage bus and transfer a voltage from each second capacitor to the reference voltage bus during the access operation, where the reference voltage may be based on transferring the voltage from each second capacitor to the reference voltage bus.

Some cases of the apparatus may include a set of cascode circuits each coupled with a capacitive circuits of the set of capacitive circuits and a memory cell of the set of memory cells, each cascode circuit configured to refrain from coupling the memory cell with the capacitive circuit during the access operation when a voltage associated with the memory cell may be less than a threshold voltage associated with the cascode circuit.

In some instances, a ratio of memory cells within the set of memory cells storing a first value to memory cells within the set of memory cells storing a second value may be within a known range.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory cell;
a capacitive circuit configured to selectively couple with the memory cell and configured to develop a signal of the memory cell during an access operation, the capacitive circuit comprising:
a first capacitor configured to selectively couple with an access line associated with the memory cell;
a second capacitor configured to selectively couple with the first capacitor; and
a switching component coupled with the first capacitor and the second capacitor and configured to selectively couple with the first capacitor and the second capacitor;
a reference voltage bus configured to selectively couple with the second capacitor during the access operation; and
a sense component configured to compare a charge stored by the first capacitor and the second capacitor with a reference voltage on the reference voltage bus.

2. The apparatus of claim 1, further comprising:
a second switching component coupled with the second capacitor and the reference voltage bus and configured to selectively couple the second capacitor with the reference voltage bus and transfer a voltage from the second capacitor to the reference voltage bus during the access operation, wherein the reference voltage is based at least in part on transferring the voltage from the second capacitor to the reference voltage bus.

3. The apparatus of claim 1, further comprising:
a cascode circuit coupled with the capacitive circuit and the memory cell, the cascode circuit configured to selectively isolate the memory cell from the capacitive circuit during the access operation when a voltage associated with the memory cell is less than a threshold voltage associated with the cascode circuit.

4. The apparatus of claim 3, wherein the cascode circuit further comprises a first transistor coupled with the capacitive circuit and a second transistor of the cascode circuit, the first transistor configured to selectively isolate the memory cell from the capacitive circuit during the access operation when the voltage associated with the memory cell is less than the threshold voltage.

5. The apparatus of claim 4, wherein the second transistor is coupled with the first transistor and the memory cell, and the second transistor is configured to selectively isolate the memory cell from the capacitive circuit during the access operation when the voltage associated with the memory cell is greater than a second threshold voltage.

6. The apparatus of claim 3, wherein the capacitive circuit further comprises a third switching component coupled with the first capacitor and the cascode circuit and configured to selectively couple the first capacitor and the second capacitor with the cascode circuit during at least a portion of a duration when the signal of the memory cell develops as part of the access operation.

7. The apparatus of claim 1, further comprising:
a second cascode circuit coupled with the reference voltage bus and configured to precharge the reference voltage bus to a precharge voltage based at least in part on a parasitic capacitance associated with the reference voltage bus, wherein the reference voltage is based at least in part on precharging the reference voltage bus to the precharge voltage.

8. The apparatus of claim 1, further comprising:
an amplifier circuit coupled with the reference voltage bus and configured to precharge the reference voltage bus to a precharge voltage based at least in part on a parasitic capacitance associated with the reference voltage bus, wherein the reference voltage is based at least in part on precharging the reference voltage bus to the precharge voltage.

9. The apparatus of claim 1, further comprising:
a third cascode circuit coupled with the reference voltage bus comprising a third transistor and configured to integrate a signal on the reference voltage bus based at least in part on a parasitic capacitance associated with the reference voltage bus, wherein the reference voltage is based at least in part on integrating the signal on the reference voltage bus.

10. The apparatus of claim 1, wherein a capacitance of the first capacitor is equal to a capacitance of the second capacitor.

11. The apparatus of claim 1, wherein the sense component comprises a plurality of transistors, each transistor of the plurality of transistors associated with a different reference voltage including at least the reference voltage, wherein each transistor of the plurality of transistors is configured to compare the charge stored by the first capacitor and the second capacitor with the different reference voltages.

12. A method, comprising:
receiving, from a host device, a read command for a set of memory cells where each memory cell of the set of memory cells is associated with a capacitive circuit comprising a first capacitor and a second capacitor;
selectively coupling each capacitive circuit with a respective memory cell based at least in part on receiving the read command;
coupling the second capacitor of each capacitive circuit to a reference voltage bus based at least in part on selectively coupling each capacitive circuit with the respective memory cell;
comparing a charge stored by the first capacitor and the second capacitor of each capacitive circuit to a reference voltage on the reference voltage bus based at least in part on coupling the second capacitor of each capacitive circuit with the reference voltage bus; and
outputting, to the host device, a set of values stored by the set of memory cells based at least in part on the comparing.

13. The method of claim 12, further comprising:
charging, based at least in part on selectively coupling the first and second capacitors of each capacitive circuit with the associated memory cell, the first and second capacitors of each capacitive circuit to a voltage based at least in part on a value stored by the associated memory cell; and
generating the reference voltage on the reference voltage bus based at least in part on coupling the second capacitor of each capacitive circuit to the reference voltage bus after charging the first and second capacitors of each capacitive circuit to the voltage that is based at least in part on the value stored by each memory cell of the set of memory cells.

14. The method of claim 13, wherein the reference voltage is based at least in part on an average voltage of each of the second capacitors after the charging the second capacitors to the voltage, wherein charging the second capacitors to the voltage is based at least in part on the value stored by each memory cell of the set of memory cells.

15. The method of claim 13, further comprising:
isolating the second capacitor from the first capacitor after charging the first and second capacitors of each capacitive circuit to the voltage, wherein selectively coupling the second capacitor of each capacitive circuit to the reference voltage bus is based at least in part on isolating the second capacitor from the first capacitor.

16. The method of claim 12, further comprising:
determining, for each memory cell from the set of memory cells, whether a voltage associated with the memory cell is less than a threshold voltage, wherein selectively coupling the first and second capacitors of each capacitive circuit with the associated memory cell of the set of memory cells is based at least in part on whether the voltage associated with the associated memory cell is less than the threshold voltage.

17. The method of claim 16, further comprising:
isolating a first memory cell of the set of memory cells from the first and second capacitors associated with the first memory cell based at least in part on determining that the first memory cell is associated with a voltage that is less than the threshold voltage.

18. The method of claim 12, further comprising:
coupling the first capacitor with the second capacitor of each capacitive circuit based at least in part on receiving the read command; and
precharging the first and second capacitors of each capacitive circuit to a precharge voltage, wherein coupling the second capacitor of each capacitive circuit to the reference voltage bus is based at least in part on precharging the first and second capacitors of each capacitive circuit to the precharge voltage.

19. The method of claim 12, further comprising:
precharging the reference voltage bus to a precharge voltage based at least in part on a parasitic capacitance associated with the reference voltage bus, wherein coupling the second capacitor of each capacitive circuit to the reference voltage bus is based at least in part on precharging the reference voltage bus to the precharge voltage.

20. The method of claim 12, further comprising:
comparing the charge stored by the first and second capacitors of each capacitive circuit to one or more additional reference voltages based at least in part on adjusting the reference voltage on the reference voltage bus, wherein outputting the set of values stored by the set of memory cells is based at least in part on comparing the charge stored by the first and second capacitors of each capacitive circuit to the one or more additional reference voltages.

21. The method of claim 20, further comprising:
performing an error control operation on a first set of values associated with the reference voltage and one or more additional sets of values each associated with the one or more additional reference voltages, wherein outputting the set of values stored by the set of memory cells is based at least in part on performing the error control operation.

22. The method of claim 12, further comprising:
adjusting a charge stored by the first capacitor of each capacitive circuit based at least in part on comparing the charge stored by the first and second capacitors of each capacitive circuit to the reference voltage; and
comparing the adjusted charge stored by the first capacitor of each capacitive circuit to the reference voltage on the reference voltage bus based at least in part on adjusting the charge stored by the first capacitor of each capacitive circuit, wherein outputting the set of values stored by the set of memory cells is based at least in part on comparing the adjusted charge stored by the first capacitor of each capacitive circuit to the reference voltage on the reference voltage bus.

23. An apparatus, comprising:
a set of memory cells;
a set of capacitive circuits each configured to develop a signal of a memory cell from the set of memory cells during an access operation, each capacitive circuit comprising:
a first capacitor configured to selectively couple with an access line associated with the memory cell;
a second capacitor configured to selectively couple with the first capacitor; and
a switching component coupled with the first capacitor and the second capacitor and configured to selectively couple with the first capacitor and the second capacitor;
a reference voltage bus configured to selectively couple with the second capacitor of each capacitive circuit of the set of capacitive circuits during the access operation; and
a sense component configured to compare a charge stored by the first and second capacitors of each capacitive circuit with a reference voltage on the reference voltage bus.

24. The apparatus of claim 23, further comprising:
a set of second switching components each coupled with the second capacitor of each capacitive circuit and the reference voltage bus and configured to selectively couple each second capacitor with the reference voltage bus and transfer a voltage from each second capacitor to the reference voltage bus during the access operation, wherein the reference voltage is based at least in part on transferring the voltage from each second capacitor to the reference voltage bus.

25. The apparatus of claim 23, further comprising:
a set of cascode circuits each coupled with a capacitive circuits of the set of capacitive circuits and a memory cell of the set of memory cells, each cascode circuit configured to refrain from coupling the memory cell with the capacitive circuit during the access operation when a voltage associated with the memory cell is less than a threshold voltage associated with the cascode circuit.

26. The apparatus of claim 23, wherein a ratio of memory cells within the set of memory cells storing a first value to memory cells within the set of memory cells storing a second value is within a known range.

* * * * *